United States Patent

[11] 3,577,206

[72] Inventor Philip J. Ferrell
Seattle, Wash.

[21] Appl. No. 819,591
[22] Filed Apr. 28, 1969
[45] Patented May 4, 1971
[73] Assignee The Boeing Company
Seattle, Wash.

[54] COMPLEMENTARY FIELD-EFFECT TRANSISTOR MIXER
7 Claims, 4 Drawing Figs.

[52] U.S. Cl. ........ 307/240, 307/229, 307/251, 328/158, 330/10, 330/69, 332/43B
[51] Int. Cl. ........ H03k 17/00
[50] Field of Search ........ 330/9, 10, 30 (R), 30 (D), 35, 69; 307/240, 251, 255, 304; 332/43 (B); 328/158

[56] References Cited
UNITED STATES PATENTS

| | | | |
|---|---|---|---|
| 3,386,053 | 5/1968 | Priddy ........ | 307/251X |
| 3,397,353 | 8/1968 | Hitt et al. ........ | 330/384X |
| 3,484,723 | 12/1969 | Rypkema ........ | 332/43X |
| 3,499,169 | 3/1970 | McVey et al. ........ | 307/304X |
| 3,510,684 | 5/1970 | Martin ........ | 307/251X |

*Primary Examiner*—Roy Lake
*Assistant Examiner*—James B. Mullins
*Attorneys*—Glenn Orlob, Kenneth M. MacIntosh and Kenneth W. Thomas

ABSTRACT: A pair of complementary field-effect transistors with common source connections are connected with a first input signal identically common to both drains and a second input signal identically common to both gates so as to give a mixed first and second signal output through a balanced subtractor connected between the drains.

INVENTOR
PHILIP J. FERRELL
BY
Kenneth M. MacIntosh
ATTORNEY

COMPLEMENTARY FIELD-EFFECT TRANSISTOR MIXER

BACKGROUND OF THE INVENTION

This invention relates to mixers and more particularly to mixers using complementary field-effect transistors.

U.S. Pat. No. 3,246,177 issued to J. O. Schroeder discloses some related field-effect transistor art in the form of various field-effect switching circuit arrangements wherein a "double-ended" (i.e., a signal and its 180° inverse) switching signal is applied respectively across the gates of two field-effect transistors of like kind (i.e., not complementary) in order to provide demodulation in the form of a synchronous detector. The circuits are otherwise different from the present invention in that none of them employ a balanced subtractor across the two field-effect transistor drains.

Burns, et al., (U.S. Pat. No. 3,260,863) is another showing of FET circuits. In Burns, complementary (i.e., "opposite conductivity types") transistors 20, 28 (or 75, 74) are respectively source-to-drain connected so that one transistor acts as a load on the other transistor in order to provide a threshold or voltage-level-recognition circuit. This is to be contrasted with the circuit of the present invention wherein there is neither threshold-circuit operation nor does one transistor act as a load on the other.

Thus, complementary FET's, although having made a limited appearance in the prior art, heretofore have not, in one manner or another, realized the potential provided by the present invention.

SUMMARY OF THE INVENTION

Accordingly, it is an object of this invention to provide an improved signal mixer circuit using complementary field-effect transistors.

Another object of this invention is to provide a field-effect transistor mixer utilizing a minimum of components.

A further important object of this invention is to provide a mixer which can operate from low input from two signals and provide a continuous output signal amplitude directly dependent on both input signal amplitudes.

Still another object of this invention is to provide a field-effect transistor mixer directly responsive to a single-ended input and providing an output through a balanced subtractor.

A still further object of this invention is to provide a signal mixer which has special utility as a speech inverter.

A further object of this invention is to provide an apparatus embodying a method of mixing signals.

These and other objects of this invention are realized by a pair of complementary field-effect transistors with common source connections that are connected with a first input signal which is identically common (i.e., single ended) to both drains; and a second input signal identically common to both gates so as to give a mixed first and second output signal through a balanced subtractor connected between the drains.

DESCRIPTION OF THE PREFERRED EMBODIMENTS

Figure 1:
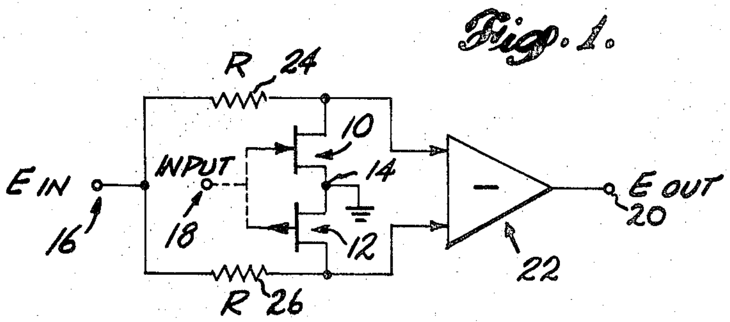
FIG. 1 is an electrical schematic of a pair of complementary field-effect transistors having a differential amplifier output all arranged according to the teachings of this invention.

As illustrated by the electrical schematic of FIG. 1, a first input signal 16 is provided through current-limiting and biasing first and second resistors 24, 26 "identically" to "complementary" field-effect transistors 10, 12. By "identically" it is meant that the connection is such that the same first signal—neither altered in form, frequency, phase nor amplitude—is applied to both drains. By "complementary" it is meant that the source-to-drain conduction of one of the field-effect transistors 10 is oppositely affected from that of the other field-effect transistor 12 by the same polarity signal, applied to the respective gates.

Field-effect transistors 10, 12 may be either of the junction type or insulated gate type and while the operating characteristics of each type may make one or the other necessary for a particular embodiment of this invention, the embodiments described herein may use either type. However, the use of insulated gate FET's possesses certain advantages in that complex biasing networks, well known in the art, are not required as they are for the use of junction FET's. Therefore FET's 10, 12 will be understood to be insulated gate FET's unless specified otherwise hereinafter.

A first resistor 24 is connected to provide the first input signal 16 directly both to the collector of the first FET 10 and one input of a balanced subtractor amplifier 22. A second resistor 26 is connected to provide the first input signal 16 directly both to the collector of the second FET 12 and the other input of the balanced subtractor amplifier 22. The sources of the FET's 10, 12 are connected together and thence directly to a common ground 14. A second input signal 18 can be obtained by shorting (dashed lines) the gates of the two FET's 10, 12 together to provide a common second input 18. See FIG. 2 for an alternative input providing DC isolation by the use of capacitive coupling (32, 34). The respective input signals 16 or 18 are between the input 16 or 18 and the same common ground 14 used for the common FET 10, 12 source connection. A mixed -first -and- second signal is obtained from the output 20 of the balanced subtractor amplifier 22 (referred to the same common ground 14 of the inputs).

Figure 2:
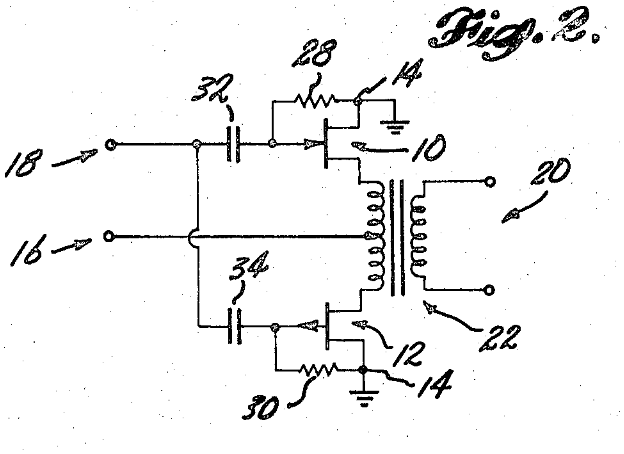
FIG. 2 is an electrical schematic of a pair of complementary field-effect transistors having a differential transformer all arranged according to the teachings of this invention.

Another embodiment of this invention is shown in FIG. 2 where a transformer 22 is shown substituted for the balanced subtractor amplifier 22 of FIG. 1. More particularly, the first input signal 16 is provided into a center tap on the primary side of the transformer 22 and the primary winding is connected between the collectors of the FET's 10, 12. Impedance means, such as the current-limiting or biasing resistors 24, 26 as shown in FIG. 1, are omitted from the circuit of FIG. 2. Again, as in FIG. 1, the sources of the FET's are commonly connected to the common ground 14. The second input signal 18 is obtained through first and second capacitors 32, 34 respectively connecting the second input signal 18 to the gates of the FET's 10, 12. First and second gate biasing resistors 28, 30 are connected between the respective FET 10, 12 gates and common ground 14. Mixed first and second output signal 20 is obtained from the secondary winding of the transformer 22. The capacitive coupling in conjunction with high impedance biasing resistors 28, 30 make this embodiment particularly suitable for use with junction FET's.

A junction FET found suitable for use in the above embodiments is a Motorola model MPF105N-channel or a model 2N 4360P-channel.

A balanced subtractor amplifier 22 which has been found to be suitable for use in the embodiment of FIG. 1 is a Fairchild model $\mu$A 702 differential amplifier.

A suitable transformer 22 for the embodiment of FIG. 2 is a UTC model SO–8.

Figure 3:
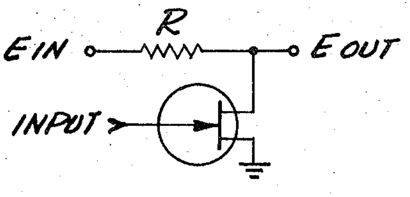
FIG. 3 is an electrical schematic for one of the field-effect transistors of FIGS. 1 and 2 used in explaining the operation of the apparatus of FIGS. 1 and 2.
Figure 4:
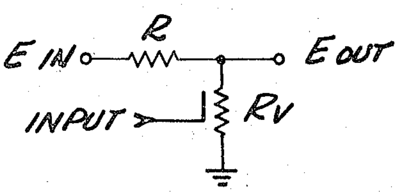
FIG. 4 is the equivalent electrical schematic for the circuit of FIG. 3.

The operation of the subject invention is explained with particular reference to FIGS. 1, 3 and 4, with identical operation being understood to be provided by the embodiment of FIG. 2.

FIG. 3 shows one (either) FET 10 or 12 removed from the remainder of the circuit of FIG. 1. $E_{in}$, INPUT and $E_{out}$ in addition to the respective reference numerals 16, 18 and 20 are shown both in FIG. 1 and again in FIG. 2 in order to emphasize the equivalent operational significance of these points in connection with the explanation of the operation of the two FIGS. 1 and 2. More particularly, FIG. 3 shows each of the FET's of FIG. 1 to be in series with its resistor R to the $E_{in}$ signal such that another signal marked INPUT can control the conductance of the FET in order to provide voltage divider operation as depicted in FIG. 4, the electrical equivalent circuit for FIG. 3.

Since the two FET's have opposite conductivity trends (complementary FET's) for identical signals, the mixed difference in the $E_{in}$ and the INPUT signals is emphasized and this difference is taken by the balanced subtractor 22 (FIG. 1) to provide a mixed first and second output signal, 20 or $E_{out}$.

This invention offers unusual facility as a speech inverter and when operated with low signal levels provides a signal output amplitude (contrary to the usual mixer operation) directly dependent on the amplitudes of the two input signals thereby providing a true continuous multiplier of the mixed signals. Other desirable operational features include switching-mode operation when a junction FET is substituted for the insulated gate FET's of the preferred embodiments described in connection with FIGS. 1 and 2. Further, the FET's of FIGS. 1 and 2, each being biased to the midpoint of its characteristic for linear operation as a true continuous multiplier of mixed signals may in an instant be driven into a switching mode of operation, without adding or changing components, by merely overdriving the FET into saturation by the gate input 18. Further information as to FET theory, operation and basic engineering may be obtained from Application Note AN-211 entitled "Field-Effect Transistors in Theory and Practice" by Motorola Semiconductor Products, Inc., Box 955, Phoenix, Ariz. 85001.

I claim:

1. An electronic mixer circuit for mixing first and second electrical signals comprising:
   a. a pair of complementary field-effect transistors each having a source electrode, a gate electrode, and a drain electrode; and said pair of transistors having their source electrodes commonly connected;
   b. first electrical signal input impedance means connected to the drain electrodes of each of the transistors for simultaneously applying a first electrical input signal identically to each transistor;
   c. second electrical signal input means connected to the gate electrodes of each of the transistors for simultaneously applying a second electrical input signal identically to each transistor; and
   d. balanced electrical signal subtraction means connected between the drain electrodes of each of the transistors for providing an electrical output signal comprised of a mixture of the first and the second electrical input signals.

2. An electronic mixer circuit as claimed in claim 1 wherein said signal subtraction means is a transformer.

3. An electronic mixer circuit as claimed in claim 1 wherein said signal subtraction means is a differential amplifier. 9

4. An electronic mixer circuit as claimed in claim 1 wherein said complementary field-effect transistors are junction field-effect transistors.

5. An electronic mixer circuit as claimed in claim 1 wherein said complementary field-effect transistors are insulated-gate field-effect transistors and wherein said complementary field-effect transistors are each biased to the midpoint of their characteristic such that each field-effect transistor acts as a linear amplifier thereby providing 180° oppositely varying signals from the two field-effect transistor drains as a result of a common simultaneously and identically applied signal input to the gates of the field-effect transistors.

6. An electronic mixer circuit as claimed in claim 5 wherein each field-effect transistor, although initially biased to act as a linear amplifier, is overdriven to saturation by a large gate signal such that a chopping action is obtained from the field-effect transistors for a signal commonly applied to the sources.

A method of mixing first and second electrical signals comprising the steps of:
   a. applying the first electrical signal identically to each of the gate electrodes of a pair of complementary field-effect transistors, each of said transistors have a gate electrode, a drain electrode, and commonly connected source electrodes;
   b. applying the second electrical signal identically to the drain electrodes of the transistors; and
   c. subtracting the resulting electrical signal difference between the drain electrodes of the transistors to provide an electrical output signal comprised of a mixture of the first and second electrical signals.